(12) United States Patent
Guo et al.

(10) Patent No.: US 11,482,691 B2
(45) Date of Patent: Oct. 25, 2022

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Tianfu Guo, Hubei (CN); Jing Huang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 145 days.

(21) Appl. No.: 16/761,427

(22) PCT Filed: Oct. 12, 2019

(86) PCT No.: PCT/CN2019/110832
§ 371 (c)(1),
(2) Date: May 4, 2020

(87) PCT Pub. No.: WO2021/017172
PCT Pub. Date: Feb. 4, 2021

(65) Prior Publication Data
US 2021/0408468 A1    Dec. 30, 2021

(30) Foreign Application Priority Data
Jul. 30, 2019    (CN) .......................... 201910693009.8

(51) Int. Cl.
| | | |
|---|---|---|
| *H01L 51/52* | (2006.01) | |
| *H01L 51/56* | (2006.01) | |
| *H01L 27/32* | (2006.01) | |

(52) U.S. Cl.
CPC ...... *H01L 51/5253* (2013.01); *H01L 51/5259* (2013.01); *H01L 51/56* (2013.01); *H01L 27/3246* (2013.01)

(58) Field of Classification Search
CPC . H01L 51/5253; H01L 51/5259; H01L 51/56; H01L 33/62; H01L 51/5256; H01L 27/3244; H01L 27/3246
(Continued)

(56) References Cited

U.S. PATENT DOCUMENTS

| 2007/0164666 A1 | 7/2007 | Oosono et al. |
|---|---|---|
| 2016/0260929 A1 | 9/2016 | Oh et al. |

(Continued)

FOREIGN PATENT DOCUMENTS

| CN | 103904230 A | 7/2014 |
|---|---|---|
| CN | 104505468 A | 4/2015 |

(Continued)

*Primary Examiner* — Thinh T Nguyen

(57) ABSTRACT

A display panel and a manufacturing method thereof are provided. The display panel includes a substrate, a first inorganic layer, an organic layer, and a water absorption laminated layer. The display panel manufacturing method includes a substrate provided step, a first inorganic layer formation step, an organic layer formation step, a second inorganic layer formation step, and a water absorption laminated layer formation step.

4 Claims, 5 Drawing Sheets

(58) Field of Classification Search
USPC .................................. 257/40; 438/82, 99
See application file for complete search history.

(56) References Cited

U.S. PATENT DOCUMENTS

| | | | |
|---|---|---|---|
| 2016/0365538 A1 | 12/2016 | Qian | |
| 2017/0222192 A1 | 8/2017 | You et al. | |
| 2018/0248153 A1* | 8/2018 | Cui ..................... | H01L 51/5256 |
| | | | 257/40 |
| 2021/0210719 A1* | 7/2021 | Sun et al. ........... | H01L 51/5253 |
| | | | 257/40 |

FOREIGN PATENT DOCUMENTS

| | | |
|---|---|---|
| CN | 105098090 A | 11/2015 |
| CN | 107068904 A | 8/2017 |
| CN | 108511629 A | 9/2018 |
| CN | 108878686 A | 11/2018 |
| CN | 109728191 A | 5/2019 |

\* cited by examiner

DISPLAY PANEL AND MANUFACTURING METHOD THEREOF

FIELD OF DISCLOSURE

The present disclosure relates to the field of displays, and in particular to a display panel and a manufacturing method thereof.

BACKGROUND

In comparison with traditional liquid crystal displays (LCDs), display panels have advantages of light weight, wide viewing angles, fast response times, low temperature resistance, and high luminous efficiency. Therefore, in the display industry the display panels have been regarded as a next generation of new display technology, especially organic light-emitting diodes (OLEDs) can be flexible and formed on a flexible substrate, which is a unique advantage of the OLEDs. In order to realize this advantage (i.e., flexible display) of the OLED, a thin film encapsulation (TFE) technology is an essential core technology.

Moisture and oxygen existing in the external environment are the most fatal factors for the display panel. There are two ways to permeate the moisture and oxygen from the external environment. One is that the moisture and oxygen directly permeates through a TFE layer from a top to a bottom into the display panel. The second is that the moisture and oxygen permeate from a side of the TFE layer into the OLED.

A conventional display panel includes a glass substrate, an array substrate, a luminous layer, and a thin film encapsulation layer. The thin film encapsulation layer includes a first inorganic layer, an organic layer, and a second inorganic layer, which is a sandwich structure and is a relatively conventional TFE layer structure in the industry. A water vapor transmission rate (WVTR) of this sandwich structure can achieve <5 E-4 g/m2/day. The first inorganic layer and the second inorganic layer are mainly used to prevent the external moisture and oxygen from permeating into the organic layer inside the display panel. Because a film texture of the organic layer is loose and porous, it does not have any ability to block moisture and oxygen. Therefore, the display panel has a poor performance of blocking moisture and oxygen.

In the prior art, the thin film encapsulation structure employs an aluminum oxide layer and a polypropylene (PP) layer to form a laminated layer. This laminated layer theoretically has a good performance of blocking moisture and oxygen. However, in an actual process production, the thin film encapsulation will encapsulate unavoidable foreign substances in the process, so the actual performance of blocking moisture and oxygen is often poor.

In U.S. Publication Patent No. 2015-0021565 and U.S. Publication Patent No. 2015-0048331, a thin film encapsulation layer includes a first inorganic layer, a first organic layer, a second inorganic layer, a second organic layer, and a third inorganic layer. The first inorganic layer is made of aluminum oxide. Main disadvantage of this structure of the thin film encapsulation layer is that the laminated structure of the inorganic layer and the organic layer is too thick, resulting in relatively poor bending resistance, so that the layers are often subjected to excessive stress, and it may even cause warpage of a lower luminous layer of the display panel, which is not conducive to a long-term development of the flexible display panel.

SUMMARY OF DISCLOSURE

In order to solve the above problems, the present disclosure provides a display panel to solve the technical problems that the performance of blocking moisture and oxygen in the prior art is poor, the flexibility performance is poor, and the display panel is normally emitted out.

In order to achieve the above object, the present disclosure provides a display panel, including a substrate and a thin film encapsulation layer. The thin film encapsulation layer includes a first inorganic layer, an organic layer, a second inorganic layer, and at least one water absorption laminated layer. The first inorganic layer is disposed on a surface of the substrate. The organic layer is disposed on a surface of the first inorganic layer away from the substrate. The second inorganic layer is disposed on a surface of the organic layer away from the first inorganic layer. The at least one water absorption laminated layer disposed between the organic layer and the first inorganic layer and/or disposed between the organic layer and the second inorganic layer.

Furthermore, the at least one water absorption laminated layer includes a dense layer and a water absorption layer attached to a surface of the dense layer.

Furthermore, in response to including more than two layers of water absorption laminated layers, a dense layer of one of the water absorption laminated layers is attached to a water absorption layer of another one of the water absorption laminated layers.

Furthermore, a thickness of the dense layer ranges from 1 nm to 1000 nm, and a refractive index of the dense layer is greater than 1.6. A thickness of the water absorption layer ranges from 1 nm to 3000 nm.

Furthermore, material of the dense layer includes any one of aluminum oxide, titanium oxide, and zirconium oxide, and material of the water absorption layer includes any one of silicon oxide, zinc oxide, magnesium oxide, and aluminum-based organic-inorganic composite.

In order to achieve the above object, the present disclosure also provides a manufacturing method of a display panel, including steps as follows. A substrate provided step is performed for providing a substrate. A thin film encapsulation layer formation step is performed for forming a thin film encapsulation layer on an upper surface of the substrate. The thin film encapsulation layer formation step includes steps as follows. A first inorganic layer formation step is performed for forming a first inorganic layer on the upper surface of the substrate. An organic layer formation step is performed for forming an organic layer on the inorganic layer. A second inorganic layer formation step is performed for forming a second inorganic layer on the organic layer. The thin film encapsulation layer formation step further includes a step as follows. A water absorption laminated layer formation step is performed for forming at least one water absorption laminated layer between the organic layer and the first inorganic layer and/or between the organic layer and the second inorganic layer.

Furthermore, in the water absorption laminated layer formation step, the at least one water absorption laminated layer is deposited on an upper surface of the first inorganic layer. In the organic layer formation step, the organic layer is formed on an upper surface of the water absorption laminated layer.

Furthermore, the water absorption laminated layer formation step includes steps as follow. A dense layer deposition step is performed for depositing a dense layer on the upper surface of the first inorganic layer. A water absorption layer deposition step is performed for depositing a water absorption layer on an upper surface of the dense layer. The dense layer deposition step and the water absorption layer deposition step are performed at least once.

Furthermore, the water absorption laminated layer formation step includes steps as follow. A water absorption layer deposition step is performed for depositing a water absorption layer on the upper surface of the first inorganic layer. A dense layer deposition step is performed for depositing a dense layer on an upper surface of the water absorption layer. The water absorption layer deposition step and the dense layer deposition step are performed at least once.

Furthermore, in the water absorption laminated layer formation step, the at least one water absorption laminated layer is deposited on an upper surface of the organic layer. In the second inorganic layer formation step, the second inorganic layer is formed on an upper surface of the water absorption laminated layer.

Furthermore, the water absorption laminated layer formation step includes steps as follow. A dense layer deposition step is performed for depositing a dense layer on the upper surface of the organic layer. A water absorption layer deposition step is performed for depositing a water absorption layer on an upper surface of the dense layer. The dense layer deposition step and the water absorption layer deposition step are performed at least once.

Furthermore, the water absorption laminated layer formation step includes steps as follow. A water absorption layer deposition step is performed for depositing a water absorption layer on the upper surface of the organic layer. A dense layer deposition step is performed for depositing a dense layer on an upper surface of the water absorption layer. The water absorption layer deposition step and the dense layer deposition step are performed at least once.

Furthermore, in the dense layer deposition step, an aluminum oxide, a titanium oxide, or a zirconium oxide is deposited by an atomic layer deposition method. In the water absorption layer deposition step, a silicon oxide, a zinc oxide, a magnesium oxide, or an aluminum-based organic-inorganic composite is deposited by a chemical vapor deposition method, the atomic layer deposition method, or a physical vapor deposition method.

Advantages of the present disclosure are as follow. A display panel and a manufacturing method thereof are provided. The water absorption laminated layer is disposed between the inorganic layer and the organic layer and is configured to prevent the external moisture and oxygen from permeating into the organic layer of the display panel through the inorganic layer. The water absorption laminated layer has high density and water absorption capability, so that the thin film encapsulation layer has high performance of blocking moisture and oxygen and exhibits good flexibility. Also, a light transmittance of the display panel is increased.

Figure 1:
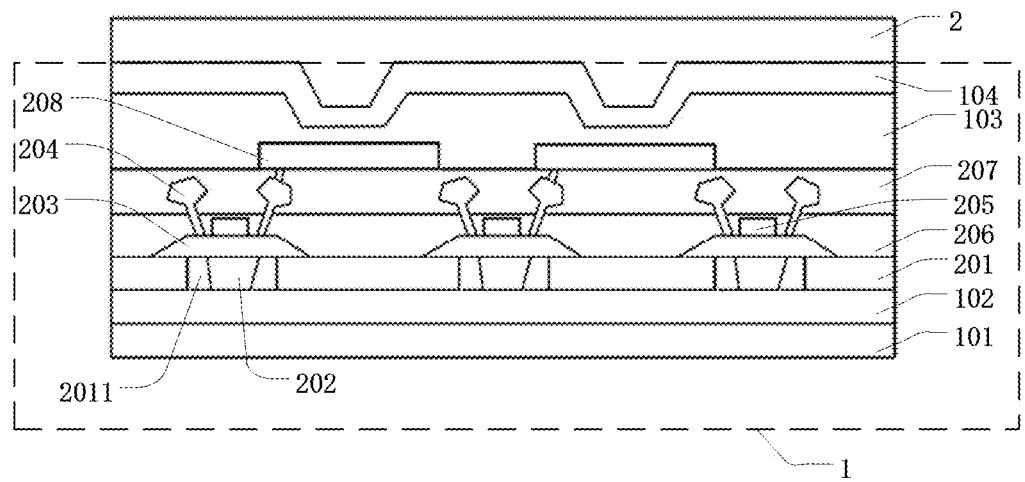
FIG. 1 is a schematic diagram of an organic light-emitting diode (OLED) display device of a first embodiment.

Reference numerals of components in the drawings are as follows.

1 substrate; 2 thin film encapsulation layer; 101 glass substrate; 102 polyimide (PI) base; 103 pixel definition layer; 104 luminous layer; 201 active layer; 202 polysilicon layer; 203 dielectric layer; 204 source and drain; 205 gate; 206 insulating layer; 207 planarization layer; 208 anode; 2011 doped area; 210 first inorganic layer; 211 water absorption laminated layer; 212 organic layer; 213 second inorganic layer; 221 first water absorption laminated layer; 231 second water absorption laminated layer; 2111 dense layer; 2112 water absorption layer

DETAILED DESCRIPTION

The following description with reference to the accompanying drawings are preferred embodiments of the present disclosure, in order to exemplify how the present disclosure may be implemented, these embodiments may describe the technical content of the present disclosure to those skilled in the art, so inventive technical content is clearer and easier to understand. However, embodiments of the present disclosure can be in many different forms, and the scope of the present disclosure is not limited to the embodiments mentioned in the text.

First Embodiment

As shown in FIG. 1, the present disclosure provides a display panel, including a substrate 1 and a thin film encapsulation layer 2 disposed on an upper surface of the substrate 1.

The substrate 1 includes a glass substrate 101, a PI base 102, thin film transistors, a pixel definition layer 103, and a luminous layer 104.

The glass substrate 101 is a glass substrate as the prior art. The PI base 102 is a flexible substrate whose material is mainly polyimide (PI). The PI material can effectively increase a light transmittance. Each thin film transistor includes an active layer 201 (P-type doping), a polysilicon layer 202, a dielectric layer 203, a source and drain 204, a gate 205, an insulating layer 206, a planarization layer 207, and an anode 208. Specifically, the active layer 201 is provided with a doped area 2011. The doped area 2011 may be doped with a P-type impurity or an N-type impurity to form a connection region of the source and drain of a MOS transistor. The connection region is connected to source and drain 204. The polysilicon layer 202 is configured to form a connection region of a gate of the MOS transistor, and the connection region is connected to the gate 205. The dielectric layer 203 is used to insulate the source and drain 204 from the gate 205 to avoid short-circuiting between two electrodes. The insulating layer 206 is disposed on upper surfaces of the active layer 202, the dielectric layer 203, and the gate 205, and the source and drain 204 extends through the insulating layer 206. The planarization layer 207 is disposed on upper surfaces of the source and drain 204 and the insulating layer 206. The anode 208 is disposed on an upper surface of the planarization layer 207. The planarization layer 207 is generally made of a polymethyl methacrylate or nanoparticle composite material, and has good heat resistance. The pixel definition layer 103 is disposed on upper surfaces of the anode 208 and the planarization layer 207. The luminous layer 104 is disposed on an upper surface of the pixel definition layer 103. A cathode (not shown) is disposed on the luminous layer 104.

Figure 2:
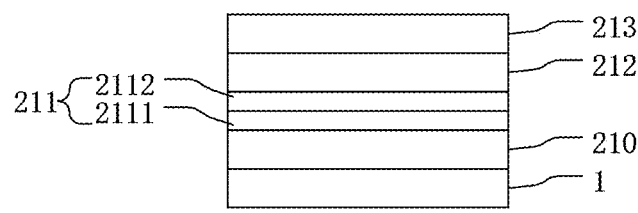
FIG. 2 is a schematic diagram of a thin film encapsulation layer of the first embodiment.
Figure 3:
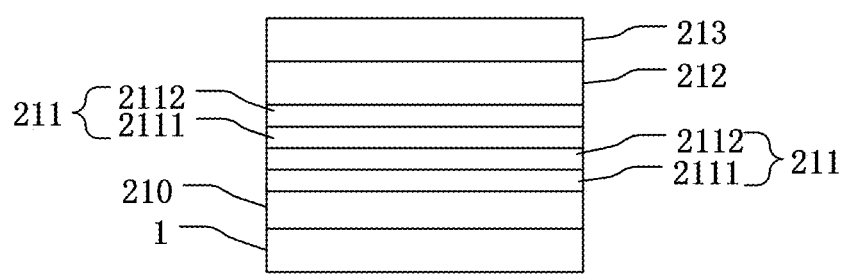
FIG. 3 is another schematic diagram of a thin film encapsulation layer of the first embodiment.

As shown in FIG. 2 to FIG. 3, the thin film encapsulation layer 2 includes a first inorganic layer 210, an organic layer 212, and a second inorganic layer 213. The first inorganic layer 210 is disposed on the upper surface of the substrate 1, the organic layer 212 is disposed on an upper surface of the first inorganic layer 210, and the second inorganic layer 213 is disposed above the organic layer 212.

In this embodiment, the thin film encapsulation layer 2 further includes a water absorption laminated layer 211 disposed between the first inorganic layer 210 and the organic layer 212.

Each of the water absorption laminated layers 211 includes a dense layer 2111 and a water absorption layer 2112. Material of dense layer 2111 includes any of aluminum oxide, titanium oxide, and zirconium oxide, and these materials have good compactness. A thickness of the dense layer 2111 ranges from 1 nm to 1000 nm, and a refractive index of the dense layer 2111 is greater than 1.6, which enables the thin film encapsulation layer to have good flexibility and improve the light transmittance of the display panel.

Because a film texture of the organic layer 212 is loose and porous, it does not have any ability to block moisture and oxygen. External moisture and oxygen will permeate from the first inorganic layer 211 or the second inorganic layer 213 into the organic layer 212 of the display panel. Therefore, the dense layer 2111 is disposed on the upper surface of the first inorganic layer 210 or an upper surface of the organic layer 212 to enhance compactness of the organic layer 212, thereby enhancing the performance of blocking moisture and oxygen of the organic layer 212 and improving the performance of the thin film encapsulation layer 2. Material of the water absorption layer 2112 includes any one of a silicon oxide, a zinc oxide, a magnesium oxide, and an aluminum-based organic-inorganic composite. A thickness of the water absorption layer 2112 ranges from 1 nm to 3000 nm, so that the thin film encapsulation layer 2 has good absorption of water and flexibility. When the moisture and oxygen permeates into the thin film encapsulation layer 2, the moisture and oxygen can be prevented from permeating into the organic layer 212, and the performance of blocking moisture and oxygen of the thin film encapsulation layer is improved.

As shown in FIG. 2, the dense layer 2111 is disposed on the upper surface of the first inorganic layer 210, and the water absorption layer 2112 is disposed on an upper surface of the dense layer 2111, so that a high-density meta-aluminate is formed on a surface of the water absorption laminated layer 211, which enhances the performance of blocking moisture and oxygen of the thin film encapsulation layer In other embodiments, the water absorption layer 2112 may also be disposed on the upper surface of the first inorganic layer 210, and the dense layer 2111 may be disposed on the upper surface of the water absorption layer 2112, which exhibit the same as the technical effect of this embodiment.

In a modified embodiment based on this embodiment, a plurality of water absorption laminated layers 211 are disposed between the first inorganic layer 210 and the organic layer 212. A plurality of dense layers 2111 are alternately arranged with a plurality of water absorption layers 2112. As shown in FIG. 3, when a number of the water absorption laminated layers 211 is two, two dense layer 2111 and two water absorption layer 2112 are disposed between the first inorganic layer 210 and the organic layer 212, and are arranged alternately with each other.

By providing the plurality of water absorption laminated layers, a high-density meta-aluminate is formed on surfaces of the water absorption laminated layers, so that the water absorption laminated layers have good absorption of water. In comparison with the technical solution using only one water absorption laminated layer, the thin film encapsulation layer further enhances the performance of blocking moisture and oxygen.

Figure 4:
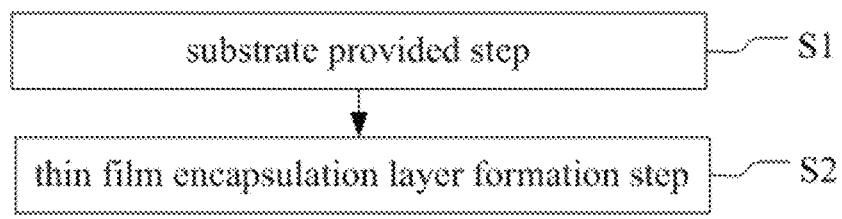
FIG. 4 is a flowchart of a manufacturing method of a display panel.

As shown in FIG. 4, the present embodiment further provides a manufacturing method of the display panel, including the following steps S1 to S2. In a substrate provided step S1, the substrate is provided. In a thin film encapsulation layer formation step S2, the thin film encapsulation layer is formed on a surface of the substrate.

Figure 5:
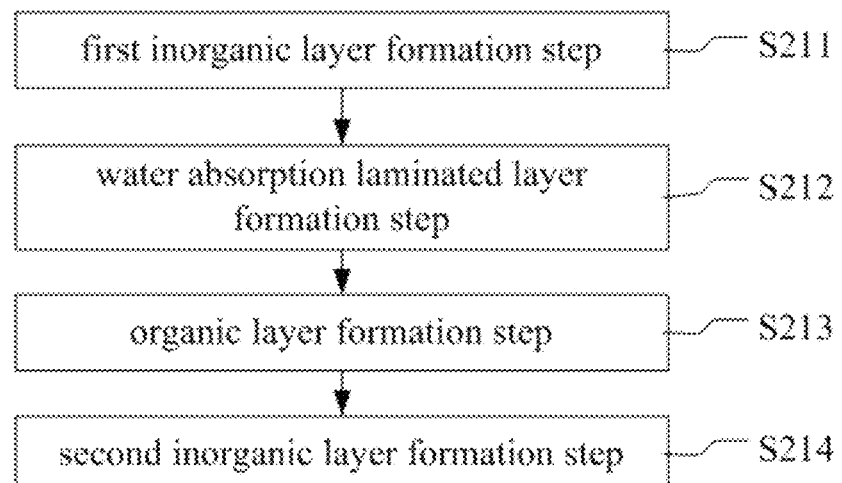
FIG. 5 is a flowchart of a thin film encapsulation layer formation step of the first embodiment.

As shown in FIG. 5, the thin film encapsulation layer formation step S2 includes steps S211 to S214. In a first inorganic layer formation step S211, the first inorganic layer is formed on the upper surface of the substrate. Specifically, the first inorganic layer is deposited on the substrate by a method such as chemical vapor deposition (CVD), physical vapor deposition (PVD) or the like. The first inorganic layer has a thickness of less than 2 μm and may be made of an inorganic compound such as silicon nitride (SiN), silicon oxynitride (SiON), or silicon monoxide (SiO). The first inorganic layer can prevent moisture and oxygen permeating from the outside, and can improve a performance of the display panel.

In a water absorption laminated layer formation step S212, the at least one water absorption laminated layer is deposited on the upper surface of the first inorganic layer. The water absorption laminated layer has a high-density meta-aluminate, which can prevent external water and oxygen permeation. The water absorption laminated layer formation step includes a dense layer deposition step and a water absorption layer deposition step, and a sequence of performing of the two steps is interchangeable.

Figure 6:
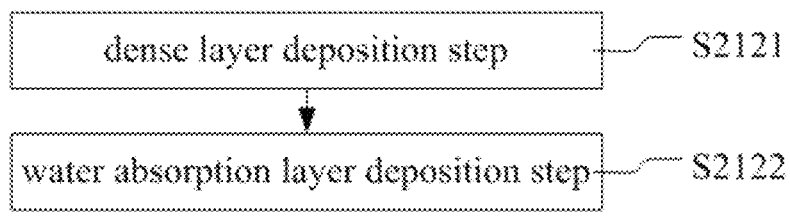
FIG. 6 is a flowchart of a water absorption laminated layer formation step of the first embodiment.

As shown in FIG. 6, the water absorption laminated layer formation step S212 includes steps S2121 to S2122.

In a dense layer deposition step S2121, the dense layer is deposited on the upper surface of the first inorganic layer. The dense layer is formed on the upper surface of the first inorganic layer by an atomic layer deposition method. Material of dense layer includes any of aluminum oxide, titanium oxide, and zirconium oxide, and these materials have good compactness. A thickness of the dense layer ranges from 1 nm to 1000 nm, and a refractive index of the dense layer is greater than 1.6, which enables the thin film encapsulation layer to have good flexibility and improve the light transmittance of the display panel.

In a water absorption layer deposition step S2122, a water absorption layer is deposited on the upper surface of the dense layer. The water absorption layer is formed on the upper surface of the dense layer by a chemical vapor deposition method, an atomic layer deposition method, or a physical vapor deposition method. Material of the water absorption layer includes any one of silicon oxide, zinc oxide, magnesium oxide, and aluminum-based organic-inorganic composite. A thickness of the water absorption layer ranges from 1 nm to 3000 nm. During the deposition process, the water absorption layer can form a dense and uniform film layer with good absorption of water. The moisture and oxygen can be prevented from permeating into the organic layer, and a performance of blocking moisture and oxygen of the thin film encapsulation layer is improved.

The user can perform the dense layer deposition step S2121 and the water absorption layer deposition step S2122 at least once as needed to form at least one water absorption laminated layer. A plurality of water absorption laminated layers exhibit more excellent absorption of water. The moisture and oxygen can be prevented from permeating, and the performance of blocking moisture and oxygen of the thin film encapsulation layer is improved.

In an organic layer formation step S214, the organic layer on an upper surface of the water absorption laminated layer. The organic layer is formed on the upper surface of the water absorption laminated layer by ink jet printing (UP), chemical vapor deposition (CVD), or evaporation method. The organic layer may be made of hexamethyldisiloxane (HMDSO), aluminum-based organic-inorganic composite (Alucone), epoxy resin, acrylic, and silicon-containing organic matter. Therefore, foreign matters may be encapsulated in the organic layer during the deposition process, a stress generated by the first inorganic layer is alleviated, thereby improving the flexibility of the display panel encapsulation.

In a second inorganic layer formation step S215, the second inorganic layer is formed on the upper surface of the organic layer. The second inorganic layer is deposited on the upper surface of the organic layer by chemical vapor deposition (CVD), physical vapor deposition (PVD) or the like. A thickness of the second inorganic layer is less than 2 μm, and the second inorganic layer may be made of an inorganic compound such as silicon nitride (SiN), silicon oxynitride (SiON) or silicon monoxide (SiO). The second inorganic layer can prevent the permeation of moisture and oxygen, and can improve the performance of the display panel.

Figure 7:
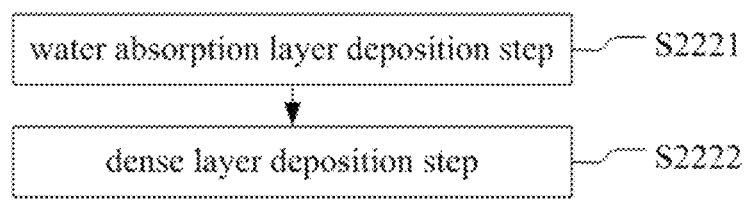
FIG. 7 is another flowchart of a water absorption laminated layer formation step of the first embodiment.

As shown in FIG. 7, in other embodiments, the water absorption laminated layer formation step S212 may include the following steps S2221 to S2222.

In a water absorption layer deposition step S2221, the water absorption layer is deposited on the upper surface of the first inorganic layer. In a dense layer deposition step S2222, the dense layer is deposited on the upper surface of the water absorption layer. The water absorption layer deposition step S2221 and the dense layer deposition step S2222 are performed at least once, so that the water absorption laminated layer has good absorption of water, can prevent moisture and oxygen from permeating into the organic layer, and improve the performance of blocking moisture and oxygen of the thin film encapsulation layer.

Figure 8:
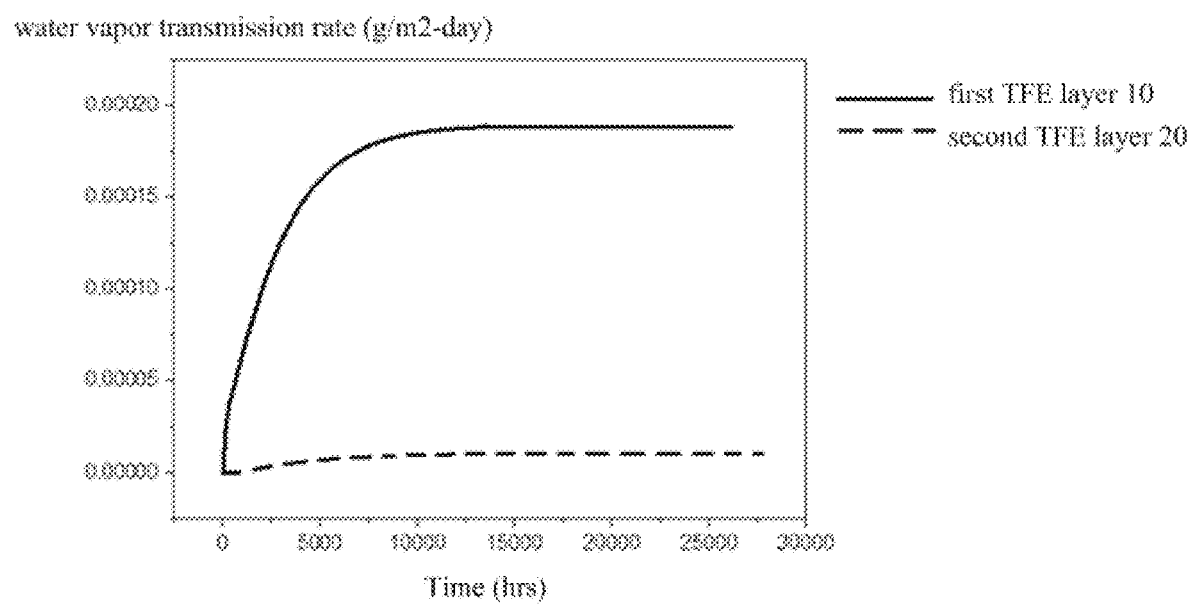
FIG. 8 is a graph showing a water vapor transmission rate of the thin film encapsulation layer of the first embodiment.

As shown in FIG. 8, in comparison a water vapor transmission rate (WVTR) of the first thin film encapsulation layer 10 provided by this embodiment with a water vapor transmission rate of a second thin film encapsulation layer 20 of the prior art, the water vapor transmission rate of the thin film encapsulation layer 10 of this embodiment is significantly improved, so that the thin film encapsulation layer exhibits good performance of blocking moisture and oxygen, and improves an encapsulation performance of the display panel.

Second Embodiment

Figure 9:
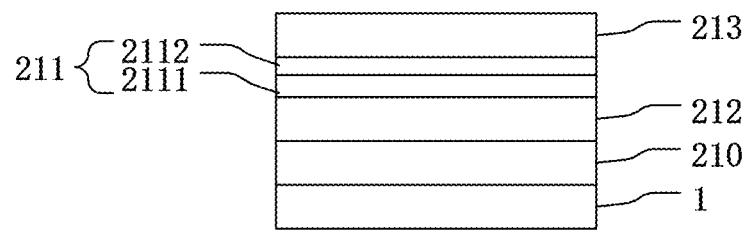
FIG. 9 is a schematic diagram of a thin film encapsulation layer of a second embodiment.

As shown in FIG. 9, this embodiment provides a display panel, which includes most of the technical features of the display panel of the first embodiment. The difference is that, in the second embodiment, a water absorption laminated layer 211 is disposed between a second inorganic layer 213 and an organic layer 212, rather than between a first inorganic layer 210 and the organic layer 212.

As shown in FIG. 9, a thin film encapsulation layer 2 of the display panel includes the first inorganic layer 210, the organic layer 212, the water absorption laminated layer 211, and the second inorganic layer 213 from bottom to top.

The water absorption laminated layer 211 includes a dense layer 2111 and a water absorption layer 2112. The dense layer 2111 is disposed on an upper surface of the organic layer 212, and the water absorption layer 2112 is disposed on an upper surface of the dense layer 2111, so that a high-density meta-aluminate is formed on a surface of the water absorption laminated layer 211 to enhance a performance of blocking moisture and oxygen of the thin film encapsulation layer.

In other embodiments, the water absorption layer 2112 may also be disposed on the upper surface of the organic layer 212, and the dense layer 2111 may be disposed on an upper surface of the water absorption layer 2112, which is the same as the technical effect of this embodiment.

In a modified embodiment of the this embodiment, a plurality of water absorption laminated layers 211 are disposed between the second inorganic layer 213 and the organic layer 212, and a plurality of dense layers 2111 are alternately arranged with a plurality of water absorption layers 2112.

By providing the plurality of water absorption laminated layers, a high-density meta-aluminate is formed on surfaces of the water absorption laminated layers, so that the water absorption laminated layers have good absorption of water. In comparison with the technical solution using only one water absorption laminated layer, the thin film encapsulation layer further enhances the performance of blocking moisture and oxygen.

Referring to FIG. 4, the present disclosure also provides a manufacturing method of a display panel, including steps S1 to S2. In a substrate provided step S1, a substrate is provided. In a thin film encapsulation layer formation step S2, the thin film encapsulation layer is formed on an upper surface of the substrate.

Figure 10:
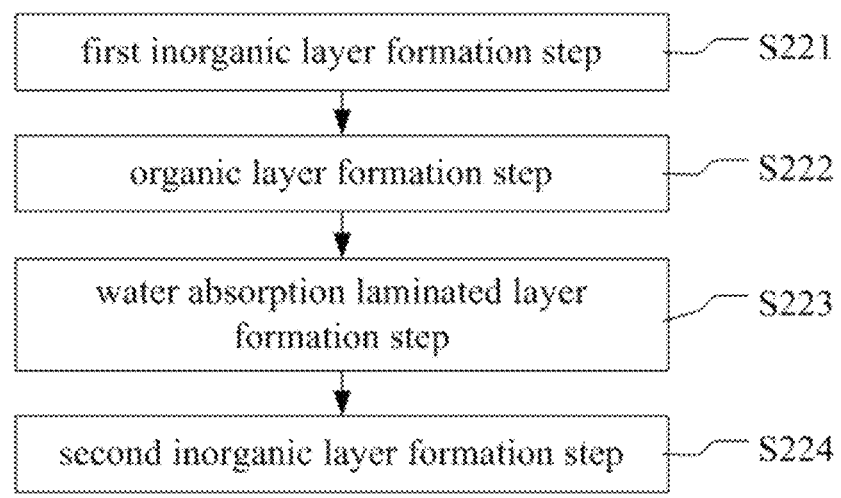
FIG. 10 is a flowchart of a thin film encapsulation layer formation step of the second embodiment.

As shown in FIG. 10, the thin film encapsulation layer formation step S2 further includes step S221 to step S224.

In a first inorganic layer formation step S221, the first inorganic layer is formed on the upper surface of the substrate In an organic layer formation step S222, the organic layer is formed on the first inorganic layer.

In a water absorption laminated layer formation step S223, the at least one water absorption laminated layer is formed on the organic layer.

In a second inorganic layer formation step S224, the second inorganic layer is formed on the water absorption laminated layer.

In comparison the steps S221 to S224 with the steps S211 to S214 of the first embodiment, the difference is that the manufacturing method of the display panel of the second embodiment performs the water absorption laminated layer formation step after the organic layer formation step. The technical effects of the respective steps are substantially the same as those of the corresponding steps in the first embodiment, and are not described herein.

In this embodiment, the display panel and the manufacturing method thereof can make the display panel have good performance of blocking moisture and oxygen, a flexible bending performance and a light transmittance of the display panel are increased.

Third Embodiment

Figure 11:
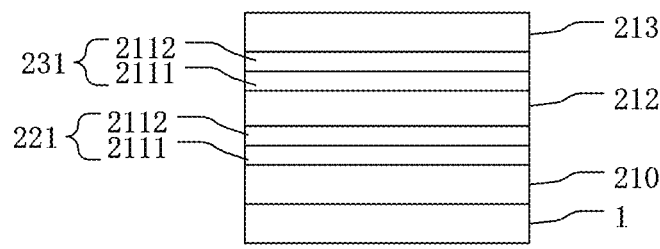
FIG. 11 is a schematic diagram of a thin film encapsulation layer of a third embodiment.

As shown in FIG. 11, this embodiment provides a display panel, which includes most of the technical features of the display panel of the first embodiment. The difference is that, in the third embodiment, a water absorption laminated layer 211 is not only disposed between a first inorganic layer 210 and an organic layer 212, but also disposed between a second inorganic layer 213 and the organic layer 212.

As shown in FIG. 11, the water absorption laminated layer 211 includes a first water absorption laminated layer 221 and a second water absorption laminated layer 231. The thin film encapsulation layer 2 of the display panel includes the organic layer 210, the first water absorption laminated layer 221, the organic layer 212, the second water absorption laminated layer 231, and the second inorganic layer 213 from bottom to top.

The water absorption laminated layer includes a dense layer 2111 and a water absorption layer 2112. The dense layer 2111 is disposed on upper surfaces of the first inorganic layer 210 and the organic layer 212, and the water absorption layer 2112 is disposed on an upper surface of the dense layer 2111, so that a high-density meta-aluminate is formed on a surface of the water absorption laminated layer 211 to enhance a performance of blocking moisture and oxygen of the thin film encapsulation layer.

In other embodiments, the water absorption layer 2112 is disposed on the upper surfaces of the first inorganic layer 210 and the organic layer 212, and the dense layer 2111 may be disposed on an upper surface of the water absorption layer 2112, which performs technical effects the same as those of this embodiment.

In a modified embodiment of the this embodiment, a plurality of water absorption laminated layers 211 are disposed between the first inorganic layer 210 and the organic layer 212, or disposed between the second inorganic layer 213 and the organic layer 212. A plurality of dense layers 2111 are alternately arranged with a plurality of water absorption layers 2112.

By providing the plurality of water absorption laminated layers, a high-density meta-aluminate is formed on surfaces of the water absorption laminated layers, so that the water absorption laminated layers have good absorption of water. In comparison with the technical solution using only one water absorption laminated layer, the thin film encapsulation layer further enhances the performance of blocking moisture and oxygen.

Referring to FIG. 4, the present disclosure also provides a manufacturing method of a display panel, including steps S1 to S2. In a substrate provided step S1, a substrate is provided. In a thin film encapsulation layer formation step S2, the thin film encapsulation layer is formed on an upper surface of the substrate.

Figure 12:
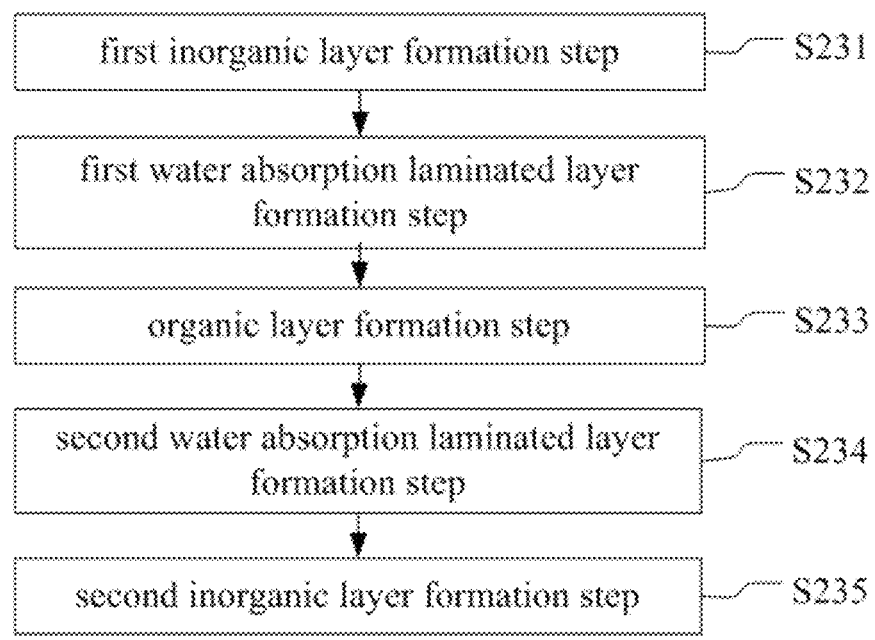
FIG. 12 is a flowchart of a thin film encapsulation layer formation step of the third embodiment.

As shown in FIG. 12, the thin film encapsulation layer formation step S2 further includes step S231 to step S235.

In a first inorganic layer formation step S231, the first inorganic layer is formed on the upper surface of the substrate In a first water absorption laminated layer formation step S232, at least one first water absorption laminated layer is deposited on an upper surface of the first inorganic layer.

In an organic layer formation step S233, the organic layer is deposited on an upper surface of the first water absorption laminated layer.

In a second water absorption laminated layer formation step S234, a water absorption laminated layer is formed on an upper surface of the organic layer.

In a second inorganic layer formation step S235, a second inorganic layer is formed on an upper surface of the second water absorption laminated layer.

In comparison the steps S231 to S235 with the steps S211 to S214 of the first embodiment, the difference is that the manufacturing method of the display panel of the third embodiment performs the water absorption laminated layer formation step after the organic layer formation step. The technical effects of the respective steps are substantially the same as those of the corresponding steps in the first embodiment, and are not described herein.

In the display panel and the manufacturing method thereof of this embodiment, the water absorption laminated layers are disposed between the first inorganic layer and the organic layer and between the second inorganic layer and the second inorganic layer. In comparison with the technical solutions of the first embodiment or the second embodiment, the water absorption performance of the two or more water absorption laminated layers is more excellent, and they have good performance of blocking moisture and oxygen permeating into the organic layer, thereby improving the performance of blocking moisture and oxygen of the thin film encapsulation layer.

The above descriptions are merely preferable embodiments of the present disclosure. Any modification or replacement made by those skilled in the art without departing from the spirit and principle of the present disclosure should fall within the protection scope of the present disclosure.

What is claimed is:
1. A display panel, comprising:
a substrate; and
a thin film encapsulation layer disposed on a surface of the substrate, and comprising:
a first inorganic layer disposed on the surface of the substrate;
an organic layer disposed on a surface of the first inorganic layer away from the substrate;
a second inorganic layer disposed on a surface of the organic layer away from the first inorganic layer; and
at least one water absorption laminated layer disposed between the organic layer and the first inorganic layer and/or disposed between the organic layer and the second inorganic layer, wherein the at least one water absorption laminated layer comprises a dense layer and a water absorption layer, the dense layer is disposed on a surface of the first inorganic layer, and the water absorption layer is attached to a surface of the dense layer.

2. The display panel as claimed in claim 1, wherein in response to comprising more than two layers of water absorption laminated layers, a dense layer of one of the water absorption laminated layers is attached to a water absorption layer of another one of the water absorption laminated layers.

3. The display panel as claimed in claim 1, wherein a thickness of the dense layer ranges from 1 nm to 1000 nm, and a refractive index of the dense layer is greater than 1.6; and a thickness of the water absorption layer ranges from 1 nm to 3000 nm.

4. The display panel as claimed in claim 1, wherein material of the dense layer comprises any one of aluminum oxide, titanium oxide, and zirconium oxide, and material of the water absorption layer comprises any one of silicon oxide, zinc oxide, magnesium oxide, and aluminum-based organic-inorganic composite.

* * * * *